(12) United States Patent
Zhao

(10) Patent No.: US 10,002,960 B2
(45) Date of Patent: Jun. 19, 2018

(54) LDMOS TRANSISTOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Meng Zhao, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days. days.

(21) Appl. No.: 15/436,905

(22) Filed: Feb. 20, 2017

(65) Prior Publication Data
US 2018/0006148 A1 Jan. 4, 2018

(30) Foreign Application Priority Data
Jun. 30, 2016 (CN) .......................... 2016 1 0504769

(51) Int. Cl.
*H01L 29/78* (2006.01)
*H01L 29/66* (2006.01)
(Continued)

(52) U.S. Cl.
CPC .... *H01L 29/7816* (2013.01); *H01L 21/26513* (2013.01); *H01L 21/26586* (2013.01);
(Continued)

(58) Field of Classification Search
CPC .... H01L 29/0878; H01L 29/66681–29/66689; H01L 29/7816–29/7826; H01L 29/0653
See application file for complete search history.

(56) References Cited

U.S. PATENT DOCUMENTS 6,599,782 B1 7/2003 Kikuchi et al.
2004/0251492 A1 12/2004 Lin
(Continued)

OTHER PUBLICATIONS

The European Patent Office (EPO) The Extended European Search Report for 17177487.0 Nov. 21, 2017 9 Pages.
(Continued)

*Primary Examiner* — Daniel Luke
(74) *Attorney, Agent, or Firm* — Anova Law Group, PLLC

(57) ABSTRACT

Lateral double-diffused MOSFET transistor and fabrication method thereof are provided. A shallow trench isolation structure is formed in a semiconductor substrate. A drift region is formed in the semiconductor substrate and surrounding the shallow trench isolation structure. A body region is formed in the semiconductor substrate and distanced from the drift region. A gate structure is formed on a portion of each of the body region, the drift region, and the shallow trench isolation structure. A drain region is formed in the drift region on one side of the gate structure. A source region is formed in the body region on an other side of the gate structure. A first shallow doped region is formed in the drain region and the drift region to surround the shallow trench isolation structure.

20 Claims, 3 Drawing Sheets

(51) Int. Cl.
  *H01L 29/08* (2006.01)
  *H01L 21/265* (2006.01)
  *H01L 21/762* (2006.01)
  *H01L 29/06* (2006.01)
  *H01L 29/10* (2006.01)
  *H01L 29/167* (2006.01)

(52) U.S. Cl.
  CPC .... *H01L 21/76224* (2013.01); *H01L 29/0653* (2013.01); *H01L 29/086* (2013.01); *H01L 29/0847* (2013.01); *H01L 29/0865* (2013.01); *H01L 29/0878* (2013.01); *H01L 29/0882* (2013.01); *H01L 29/1095* (2013.01); *H01L 29/167* (2013.01); *H01L 29/66659* (2013.01); *H01L 29/66681* (2013.01); *H01L 29/7835* (2013.01); *H01L 21/26506* (2013.01); *H01L 29/1045* (2013.01)

(56) References Cited

U.S. PATENT DOCUMENTS

2014/0042537 A1  2/2014  Birner et al.
2015/0364598 A1* 12/2015  Jung .................. H01L 29/0653
                                                    257/343
2016/0043217 A1  2/2016  Cai

OTHER PUBLICATIONS

Swain Peeyusha Saurabha et al: "On the Geometrically Dependent Quasi-Saturation and gm Reduction in Advanced DeMOS Transistors", IEEE Transactions on Electron Devices, IEEE Service Center, Pisacataway, NJ, US, vol. 63, No. 4, Apr. 1, 2016 (Apr. 1, 2016), pp. 1621-1629, XP011603968, ISSN: 0018-9383, DOI: 10.1109/TED. 2016. 2528282.

* cited by examiner

LDMOS TRANSISTOR AND FABRICATION METHOD THEREOF

CROSS-REFERENCES TO RELATED APPLICATIONS

This application claims the priority of Chinese patent application No. CN201610504769.6, filed on Jun. 30, 2016, the entire contents of all of which are incorporated herein by reference.

FIELD OF THE DISCLOSURE

The present disclosure generally relates to the field of semiconductor manufacturing technology and, more particularly, relates to a Lateral Dottile-Diffused MOSFET (LDMOS) transistor and a method of forming the LDMOS transistor.

BACKGROUND

In the semiconductor industry, there are mainly two types of power MOSFET, namely a Vertical Double-Diffused MOSFET (VDMOS) and a Lateral Double-Diffused MOSFET (LDMOS). Among them, LDMOS transistors may have many advantages over VDMOS transistors. For example, LDMOS transistors may have better thermal and frequency stability, higher gain and ruggedness, lower feedback capacitance and thermal resistance, as well as constant input impedance and a simpler bias current circuitry.

A typical N-type LDMOS structure is shown in FIG. 1. It includes a semiconductor substrate (not shown) and a P-well 100 created in the semiconductor substrate, an N-type drift region 101 formed within the P-well 100; a shallow trench isolation structure 104 formed within the N-type drift region 101 for increasing the channel length of the LDMOS transistor, which may in turn increase the breakdown voltage of the LDMOS transistor; a P-type body region 106 formed within the P-well 100 onside of the N-type drift region 101; a gate structure 105 formed on the semiconductor substrate where the gate structure 105 laterally on the P-type body region 106 and the N-type Drift region 101 and covers a portion of the shallow trench isolation structure 104. The gate structure 105 may include a gate dielectric layer formed on the semiconductor substrate, a gate electrode formed on the gate dielectric layer, and sidewall spacers formed on both sides of the gate dielectric layer and the gate electrode. A drain region 103 is formed in the N-type drift region 101 along with a source region 102 formed in the p-type body region 106, where the source region 102 and the drain region 103 are located on two sides of the gate structure, respectively, and, adjacent to the gate structure 105. Both the source region 102 and the drain region 103 are formed with N-type doping.

However, the performance of the existing LDMOS transistors still needs to be improved. For example, the operating current of the existing LDMOS transistors needs to be increased. The disclosed transistors and fabrication methods are directed to solve one or more problems of the current LDMOS transistors.

BRIEF SUMMARY OF THE DISCLOSURE

One aspect of the present disclosure provides a method of forming a lateral double-diffused MOSFET transistor. In the method, a shallow trench isolation structure is formed in a semiconductor substrate. A drift region is formed in the semiconductor substrate, the drift region surrounding the shallow trench isolation structure. A body region is formed in the semiconductor substrate and distanced from the drift region. A gate structure is formed on a portion of each of the body region, the drift region, and the shallow trench isolation structure. A drain region is formed in the drift region on one side of the gate structure. A source region is formed in the body region on an other side of the gate structure. A first shallow doped region is formed in the drain region and the drift region to surround the shallow trench isolation structure, the first shallow doped region having a same doping type as for the drain region and a depth less than the drain region and the drift region.

Another aspect of the present disclosure provides an LDMOS transistor. The LDMOS transistor includes a semiconductor substrate; a shallow trench isolation structure in the semiconductor substrate; a drift region located in the semiconductor substrate and surrounding the shallow trench isolation structure; a body region located in the semiconductor substrate and distanced from the drift region; a gate structure on a portion of each of the body region, the drift region, and the shallow trench isolation structure; a drain region located in the drift region on one side of the gate structure; a source region located in the body region on an other side of the gate structure; and a first shallow doped region located in the drain region and in the drift region to surround the shallow trench isolation structure, the first shallow doped region having a same doping type as that of the drain region and a depth less than the drain region and the drift region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
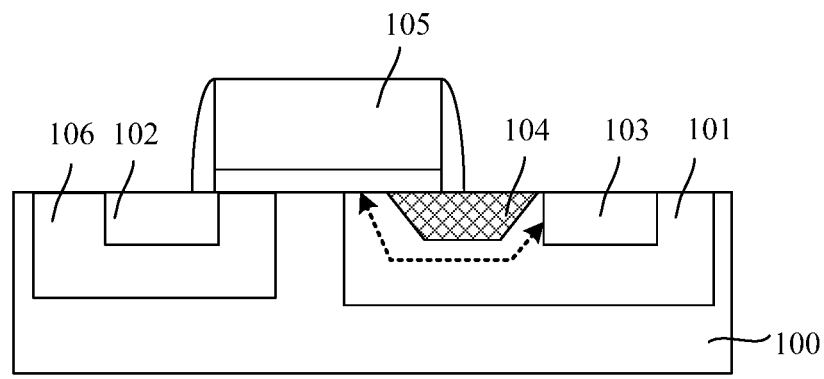
FIG. 1 illustrates an existing LDMOS transistor.

As stated in the background section the performance of existing LDMOS transistors still needs to be improved. For example, the operating current of the existing LDMOS transistors still needs to be increased.

In current technologies, the operating current of an LDMOS transistor may be limited by an on-resistance between the source region and the drain region of the LDMOS transistor and may be difficult to be increased further. Although it may be possible to increase the operating current by decreasing the size (e.g., length) of the channel between the source and drain regions or by increasing the doping dose in the source and drain regions, the corresponding breakdown voltage of the LDMOS transistor may be reduced and may cause short channel effects or other effects on electrical properties.

Furthermore, it is found that when a current process is used to form the source and drain regions by an ion implantation, the channel threshold voltage is usually adjusted by a uniform channel surface ion implantation process. This ion implantation process may result in a large channel resistance that may suppress the operating current of the LDMOS transistor. In the meantime, due to the existence of the shallow trench isolation structure (STI) in the drift region and the drain region using the current process, the accumulation distribution of the impurity ions (uneven distribution of impurity ions) may lead to local high resistance in the drift region and the drain region, and may affect the channel threshold voltage and operating current. While adjusting channel ion implantation may reduce the threshold voltage to improve the operating current, it would be difficult to make the operating voltage and operating current meet the requirements at the same time and to improve the uniformity of the impurity ion distribution.

The present disclosure provides an LDMOS transistor and a method of forming the same. The method of forming the LDMOS transistor may include forming a first shallow doped region in the drain region adjacent to one side of the gate structure and in the drift region adjacent to the bottom of the gate structure. The first shallow doped region and the drain region may have a same doping type. The depth of the first shallow doped region may be less than the depth of the drain region and the depth of the drift region.

The presence of the first shallow doped region as disclosed herein may improve the accumulation distribution of impurity ions in the drift region and the drain region caused by the existence of the shallow trench isolation structure (STI), and may increase the uniformity of the impurity ion distribution in the drain region surrounding the shallow trench isolation structure and the drift region, and reduce the resistance in the vicinity of the surface of both the drain region and the drift region while preventing the impact of the local high resistance regions on the threshold voltage. Thus, when the LDMOS transistor is in operating mode, the on-resistance of the channel, between the drain region and the source region may be reduced. Therefore, when applying a same supply voltage to the drain region, the operating current of the LDMOS transistor may be increased compared to using existing technologies. Further, by forming a first shallow doped region, the disclosed transistor and method may effectively prevent the impact of the local high resistance regions on the effective channel and reduce short channel effects while improving the channel doing uniformity through the impurity supplement principle.

The foregoing end other objects, features and advantages of the present disclosure will become more apparent from the following detailed description when taken in conjunction with the accompanying drawings. While the embodiments of the present disclosure are described in detail the illustrations are not exaggerated in a generalized scale for convenience of explanation, and the illustrations are merely exemplary and should not limit the scope of the present disclosure. In addition, the actual fabrication should include the length, width and depth of the three-dimensional parameters.

FIGS. 2-7 illustrate cross-section structures of an exemplary LDMOS transistor corresponding to certain stages of the fabrication process consistent with the disclosed embodiments. FIG. 8 illustrates an exemplary method for forming an LDMOS transistor consistent with the disclosed embodiments.

Figure 2:
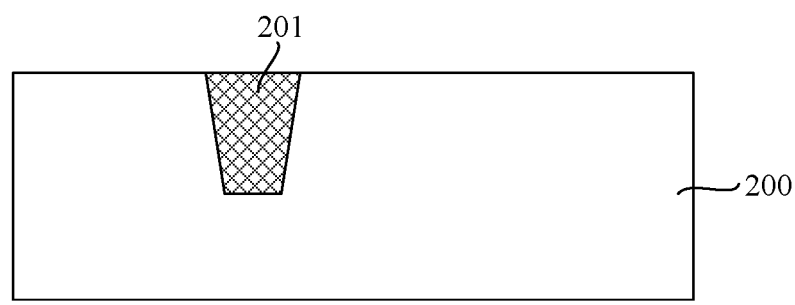
FIGS. 2-7 illustrate cross-section structures of an exemplary LDMOS transistor corresponding to certain stages of the fabrication process consistent with the disclosed embodiments.

As shown in FIG. 2, a semiconductor substrate 200 is provided as platform for forming an LDMOS transistor (e.g. Step 802 in FIG. 8). The semiconductor substrate 200 may be made of any appropriate type of semiconductor materials, such as silicon (Si), germanium (Ge), silicon germanium (SiGe), carborundum (SiC), silicon on insulator (SOI) germanium on insulator (GOI) or gallium arsenide and other Group III-V compounds, or a combination thereof. In one embodiment, the semiconductor substrate 200 is a silicon substrate.

A shallow trench isolation structure 201 may be formed in the semiconductor substrate 200 (e.g., Step 804 in FIG. 8) for increasing the channel length of the LDMOS transistor, which may in turn increase the breakdown voltage of the LDMOS transistor.

In one embodiment, the shallow trench isolation stricture 201 may be formed by forming a mask layer (not shown) on the semiconductor substrate 200. The mask layer may have an opening to expose a surface of the semiconductor substrate 200. Then, a groove may be formed in the semiconductor substrate 200 by etching along the opening in the mask layer. Further, an insulation material layer may be formed that covers the mask layer and fills the groove. The insulation material layer may be planarized until the surface of the semiconductor substrate 200 is exposed and the shallow trench isolation structure 201 is formed in the groove.

The shallow trench isolation structure 201 may have a single-layer structure or a multi-layer (e.g., having two or more layers) stack structure. In one embodiment, the multi-layer stack structure may be a two-layer stack structure, for example, including a pad layer formed on the side and bottom surfaces of the groove and a filling layer formed on the pad layer to fill up the groove. In one embodiment, the pad layer may be a silicon oxide layer and the filling layer may be a silicon nitride layer.

Figure 3:
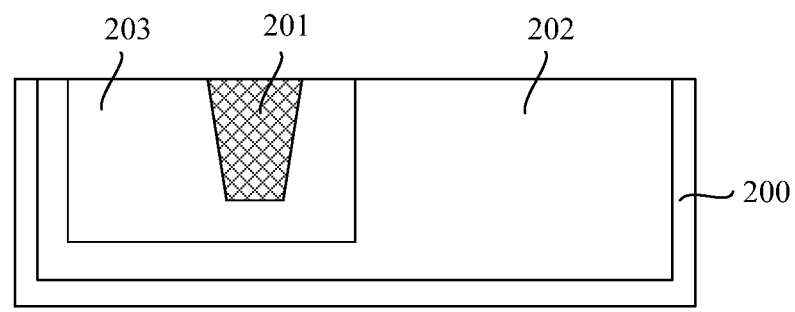

As shown in FIG. 3, a drift region 203 may be formed in the semiconductor substrate 200, and the drift region 203 may surround the shallow trench isolation structure 201 (e.g., Step 806 in FIG. 8).

Before forming the drift region 203, a well region 202 may also be formed in the semiconductor substrate 200. The drift region 203 is then formed in the well region 202. The depth of the drift region 203 may be less than the depth of the well region 202. The well region 202 may be formed prior to forming the shallow trench isolation structure 201. Alternatively, the well region 202 may be formed after the shallow trench isolation structure 201 is formed.

In one embodiment, the well region 202 and the drift region 203 may be formed by an ion implantation process, and a mask layer may be formed on the semiconductor substrate 200 prior to forming the drift region 203. The mask layer may have an opening to expose a region of the semiconductor substrate 200 for the ion implantation. In one embodiment, the well region 202 may be doped with N-type ions and the drift region 203 may be doped with P-type ions in forming a P-type LDMOS transistor. In another embodiment, the well region 202 may be doped with P-type ions and the drift region 203 may be doped with N-type ions in forming an N-type LDMOS transistor. The N-type ions may include one or more of phosphorus ions, arsenic ions and antimony ions; and the P-type ions may include one or more of boron ions, indium ions and gallium ions.

Figure 4:
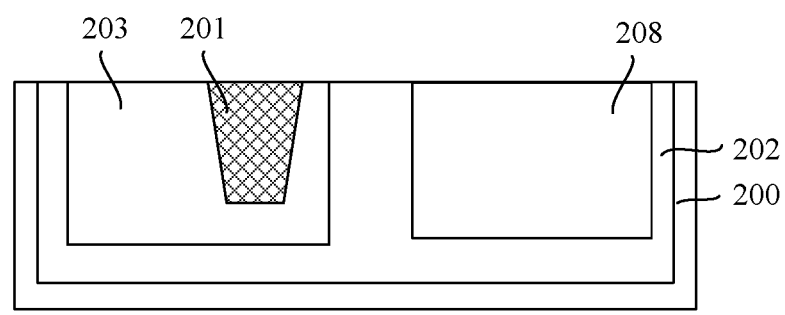

As shown in FIG. 4, a body region 208 may be formed in the semiconductor substrate 200 on a side of the drift region 203 (e.g., Step 808 in FIG. 8). The body region 208 may be formed by an ion implantation process. In one embodiment, the body region 208 may be doped with N-type ions in forming a P-type LDMOS transistor. In another embodiment, the body region 208 may be doped with P-type ions in forming an N-type LDMOS transistor. The N-type ions may include one or more of phosphorus ions, arsenic ions and antimony ions; and the P-type ions may include one or more of boron ions, indium ions and gallium ions.

In some embodiments, the body region 208 may be formed after the drift region 203 is formed. In other embodiments, the body region 208 may be formed prior to forming the drift region 203.

Figure 5:
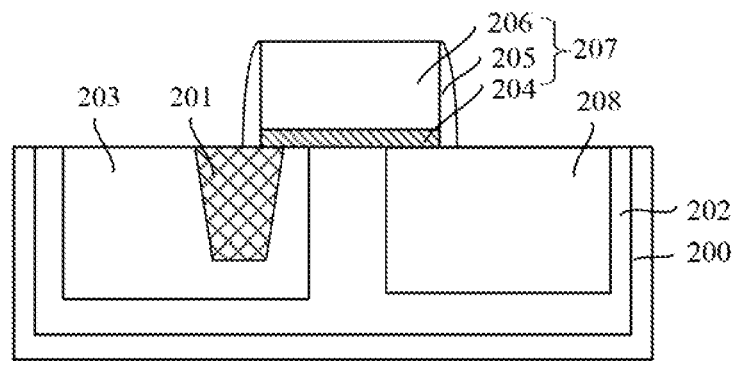

As shown in FIG. 5, a gate structure 207 may be formed on the semiconductor substrate 200. The gate stricture 207 may cover a portion of the body region 208, a portion of the well region 202, a portion of the drift region 203, and a portion of the shallow trench isolation structure 201 (e.g., Step 810 in FIG. 8).

In one embodiment, the gate structure 207 may include a gate dielectric layer 204 formed on the semiconductor substrate 200 and a gate electrode 206 formed on the gate dielectric layer 204.

In one embodiment, the gate dielectric layer 204 may be made of silicon oxide and the gate electrode 206 may be made of poly silicon. The gate structure 207 may be formed by: forming a gate dielectric material layer overlying the surface of the semiconductor substrate 200; forming a gate electrode material layer on the gate dielectric material layer; and etching the gate electrode material layer and the gate dielectric material layer to form the gate dielectric layer 204 on a portion of the body region 208, a portion of the drift region 203, a portion of the shallow trench isolation structure 201, and a surface portion of the semiconductor substrate 200 between the drift region 203 and the body region 208. After etching, the gate electrode 206 is formed on the gate dielectric layer 204.

In other embodiments, the gate dielectric layer 204 may be made of any appropriate material with high K value, such as $HfO_2$, $TiO_2$, HfZrO, HfSiNO or any combination thereof. Other materials may also be used according to various embodiments. Additionally, the gate electrode 206 may be made of any appropriate metal, such as W, Cu, Al or any combination thereof. Other materials may also be used according to various embodiments. In one embodiment, the gate structure 207 may be formed by a gate-last process.

Further, in one embodiment, side tail spacers 205 may be formed on both sides of the gate dielectric layer 204 and the gate electrode 206. The sidewall spacers 205 may protect both sides of the gate electrode 206 from being damaged when forming a first shallow doped region using an implantation process during the subsequent fabrication steps. Moreover, the sidewall spacers 205 may control location of a source region, that may be subsequently formed in the body region 208. The sidewall spacers 205 may include a single-layer structure or a multi-layer (e.g., having two or more layers) structure. The sidewall spacers 205 may be made of silicon oxide, silicon nitride or other suitable materials.

Figure 6:
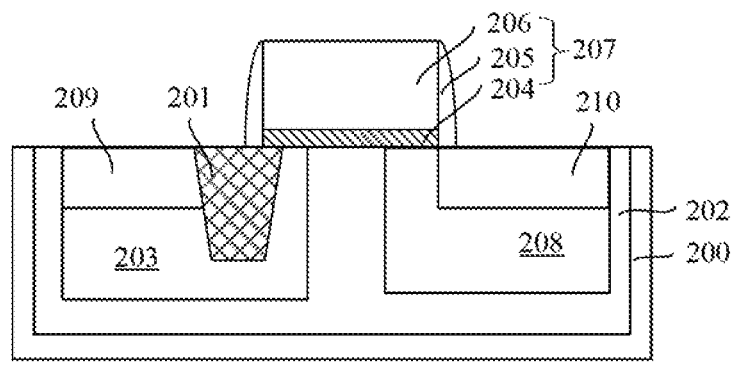

As shown in FIG. 6, a drain region 209 may be formed in the drift region 203 adjacent to one side of the gate structure 207 (e.g., Step 812 in FIG. 8); and a source region 210 may be formed in the body region 208 adjacent to the other side of the gate structure 207 (e.g., Step 814 in FIG. 8).

The drain region 209 and the source region 210 may be formed by a source-drain ion implantation process. In one embodiment, the drain region 209 and the source region 210 may be doped with P-type ions in forming a P-type LDMOS transistor. In another embodiment, the drain region 209 and the source region 210 may be doped with N-type ions in forming an N-type LDMOS transistor. The N-type ions may include one or more of phosphorus (P) ions, arsenic (As) ions and antimony (Sb) ions; and the P-type ions may include one or more of boron (B) ions, boron fluoride ($BF_2$) ions, indium (In) ions and gallium (Ga) ions.

In one embodiment, when the implanted ions during the source-drain ion implantation process include one or more of B ions, $BF_2$ ions, Ga ions or In ions, an implantation angle of approximately 0°~5°, an implantation dose of approximately 5E13 atoms/cm$^2$ to 5E15 atoms/cm$^2$, and an implantation energy of approximately 6 Kev to 50 Kev may be applied.

In another embodiment, when the implanted ions during the source-drain ion implantation process include one or more of P ions, As ions, or Sb ions, an implantation angle of approximately 0°~5°, an implantation dose of approximately 5E13 atoms/cm$^2$ to 5E15 atoms/cm$^2$, and an implantation energy of approximately 12 Kev to 50 Kev may be applied.

Figure 7:
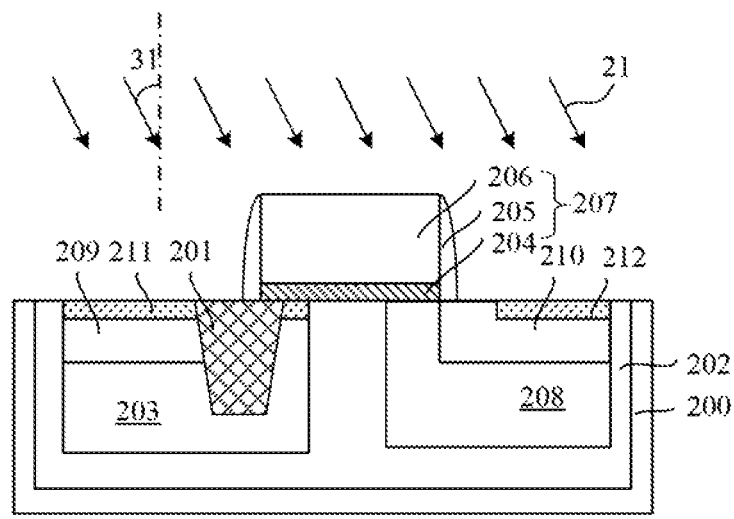
Figure 8:
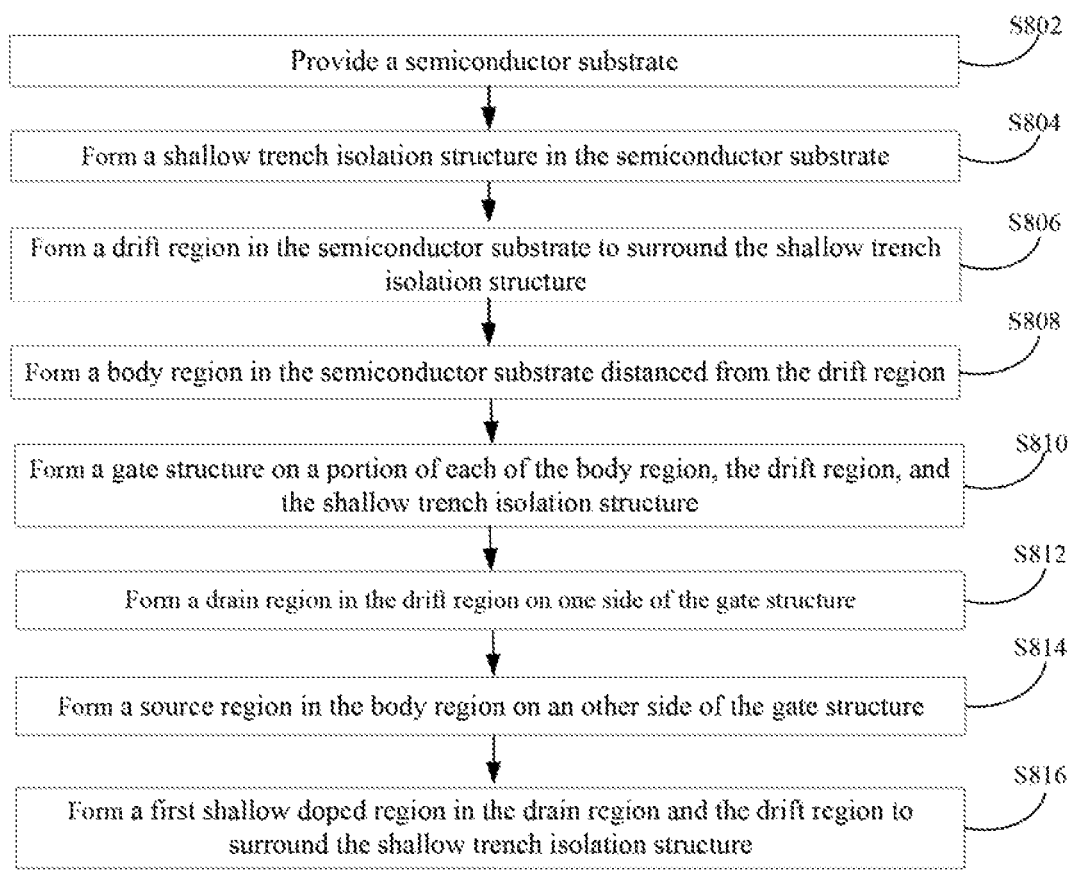
FIG. 8 illustrates an exemplary method for forming an LD transistor consistent with the disclosed embodiments.

As shown in FIG. 7, a first shallow doped region 211 may be formed in the drain region 209 adjacent to one side of the gate structure 207 and in the drift region 203 adjacent to the bottom of the gate structure 207 (e.g., Step 816 in FIG. 8). The first shallow doped region 211 and the drain region 209 may have a same doping type. The depth of the first shallow doped region 211 may be less than the depth of the drain region 209 and the depth of the drift region 203.

The first shallow doped region 211 may include two portions, one portion located in the drain region 209 on one side of the gate structure 207 and the other portion located in the drift region 203 under the bottom of the gate structure 207. The first shallow doped region 211 may surround the shallow trench isolation structure 201. While the existence of the shallow trench isolation (STI) structure 201 may often lead to an accumulation distribution of impurity ions in the drift region 203 and the drain region 209, the formed first shallow doped region 211 may be used to improve the accumulation distribution of impurity ions, increase the uniformity of the impurity ion distribution in the drain region 209 and the drift region 203 surrounding the shallow trench isolation structure 201, and reduce the resistance in the vicinity of the surface of both the drain region 209 and the drift region 203 while preventing the impact of the local high resistance regions on the threshold voltage. Thus, when the LDMOS transistor is in operating mode, the on-resistance of the channel between the drain region 209 and the source region 210 may be reduced. Therefore, when applying a same supply voltage to the drain region 209, the operating current of the disclosed LDMOS transistor may be increased compared to existing LDMOS transistors.

In one embodiment, the first shallow doped region 211 may have a depth of approximately 10 nm~50 nm from a surface of the semiconductor substrate 200 and an ion doping concentration of approximately 1E18 atom/cm$^3$ to 1E19 atom/cm$^3$. Thus, the first shallow doped region 211 may better improve the accumulation distribution of impurity ions due to the existence of the shallow trench isolation structure (STI) 201 in the drift region 203 and the drain region 209, increase the uniformity of the impurity ion distribution in the drain region 209 and the drift region 203 surrounding the shallow trench isolation structure 201, and reduce the resistance in the vicinity of the surface of both the drain region 209 and the drift region 203 while preventing the impact of the local high resistance regions on the threshold voltage. It should be noted that the depth of the first shallow doped region 211 refers to the vertical distance between the surface of the semiconductor substrate 200 and the bottom boundary of the first shallow doped region 211.

The first shallow doped region 211 may be formed using a single-angle ion implantation process 21. In the single-angle ion implantation process, implanted ions may be injected in a direction from the drain region 209 toward the source region 210. The implanted ion incident direction may have a first angle 31 made with the normal to the surface of the semiconductor substrate 200 as shown in FIG. 7, where the semiconductor substrate 200 is not rotated during the single-angle ion implantation process. Portions of the first shallow doped region 211 may be formed simultaneously in the vicinity of the surface of the drain region 209 on one side of the gate structure 207 and in the vicinity of the surface of the drift region 203 under the bottom of the gate structure 207 using the single-angle ion implantation. Thus, the process in forming the first shallow doped region 211 may be simplified.

In one embodiment, a mask layer may be formed on the semiconductor substrate 200 and the gate structure 207 prior to performing the single-angle ion implantation process. The mask layer may have an opening to expose the surface of the drain region 209 and the sidewall spacer 205 on the shallow trench isolation structure 201. The mask layer may be used as a mask for the single-angle ion implantation process.

The first shallow doped region 211 may be doped with P-type ions in forming a P-type LDMOS transistor. In one embodiment, $BF_2$ ions or B ions may be implanted using the single-angle ion implantation process. When $BF_2$ ions are being implanted, an implantation angle of approximately 15°~40°, an implantation dose of approximately 1E13 atoms/cm$^2$ to 1E14 atoms/cm$^2$, and implantation energy of approximately 5 Kev to 40 Kev may be applied. For example, the implantation angle may be set to be 15°, 20°, 30°, or 35°; the implantation dose may be set to be 2E13 atoms/cm$^2$, 3E13 atoms/cm$^2$, 4E13 atoms/cm$^2$, 5E13 atom/cm$^2$, 6E13 atoms/cm$^2$, 7E13 atoms/cm$^2$, 8E13 atoms/cm$^2$, or 9E13 atoms/cm$^2$; and the implantation energy may be set to be 10 Kev, 15 Kev, 20 Kev, 25 Kev, 30 Kev, or 35 Kev. Thus, the formed first shallow doped region 211 may have high space accuracy. The first shallow doped region 211 may effectively increase the uniformity of the impurity ion distribution in the drain region 209 and the drift region 203 surrounding the shallow trench isolation structure 201, and reduce the resistance in the vicinity of the surface of both the drain region 209 and the drift region 203. In addition, when the implanted ions are $BF_2$ ions, F ions therein may prevent the diffusion of B ions into the semiconductor substrate 200 between the drift region 203 and the body region 208 and, thus, may prevent short channel effects.

In another embodiment, in addition to $BF_2$ ions or B ions, diffusion-preventing ions such as C ions or N ions may also be implanted in the single-angle ion implantation process. The implanted C ions or N ions may prevent the diffusion of the implanted B ions into the semiconductor substrate 200 between the drift region 203 and the body region 208 and, thus, may prevent short channel effects. When C ions or N ions are being implanted, an implantation angle of approximately 15°~40°, an implantation dose of approximately 5E12 atoms/cm$^2$ to 5E15 atoms/cm$^2$, and an implantation energy of approximately 0.5 Kev to 20 Kev may be applied. For example, the implantation angle may be set to 10°, 20°, 30°, or 35°; the implantation dose may be set to 6E12 atoms/cm$^2$, 9E12 atoms/cm$^2$, 2E13 atoms/cm$^2$, 5E13 atoms/cm$^2$, 8E13 atoms/cm$^2$, 9E13 atoms/cm$^2$, 2E15 atoms/cm$^2$, or 4E15 atoms/cm$^2$; and the implantation energy may be set to 1 Kev, 2 Kev, 5 Kev, 10 Kev, 12 Kev, 14 Kev, 15 Kev, 17 Kev, 18 Kev, or 19 Kev. Thus, the position of the implanted C ions or N ions may correspond to the location of the first shallow doped region 211 and the electrical properties of the first shallow doped region 211 is not affected. In addition, the implanted C ions or N ions may effectively prevent the diffusion of B ions in the first shallow doped region 211.

In yet another embodiment, the first shallow doped region 211 may be doped with N-type ions in forming an N-type LDMOS transistor. P ions or As ions may be implanted using the single-angle ion implantation process. When P ions or As ions are being implanted, an implantation angle of approximately 15°~40°, an implantation dose of approximately 1E13 atoms/cm$^2$ to 1E14 atoms/m$^2$, and an implantation energy of approximately 8 Kev to 45 Kev may be applied. Thus, the formed first shallow doped region 211 may have high space accuracy. The first shallow doped region 211 may effectively increase the uniformity of the impurity ion distribution in the drain region 209 and the drift region 203 surrounding the shallow trench isolation structure 201 and reduce the resistance in the vicinity of the surface of both the drain region 209 and the drift region 203.

In one embodiment, in addition to P ions or As ions, diffusion-preventing ions such as C ions or N ions may also be implanted using the single-angle ion implantation process. The implanted C ions or N ions may prevent the diffusion of the implanted P ions or As ions from the first shallow doped region 211 into the semiconductor substrate 200 between the drift region 203 and the body region 208 and, thus, may prevent short channel effects. When C ions or N ions are being implanted, an implantation angle of approximately 15°~40°, an implantation dose of approximately 5E12 atoms/cm$^2$ to 5E15 atoms/cm$^2$, and implantation energy of approximately 0.5 Kev to 20 Kev may be applied. Thus, the position of the implanted C ions or N ions may correspond to the location of the first shallow doped region 211 and the electrical properties of the first shallow doped region 211 is not affected. In addition, the implanted C ions or N ions may effectively prevent the diffusion of P ions or As ions in the first shallow doped region 211.

In other embodiments when the first shallow doped region 211 is formed using the single-angle ion implantation process, a second doped region 212 may be formed simultaneously in the source region 210. The doping type of the second doped region 212 may be the same as the doping type of the source region 210. The depth of the second doped region 212 may be less than the depth of the source region 210, and the second doped region 212 may have a first distance away from the adjacent sidewall spacer of the gate structure 207. Since the second doped region 212 may be formed simultaneously with the first shallow doped region 211 and the semiconductor substrate 200 is not rotated, the gate structure 207 may block a portion of the impurity ions to be injected toward the source region during the single-angle ion implantation process. Thus, the second doped region 212 may be formed away from the sidewall spacer 205 of the gate structure 207. That is the body region 208 under the bottom of the gate structure 207 and the source region 210 will not be implanted with an inverted type of impurity ions, so as to reduce the resistance in the vicinity of the surface of the source region 210 while preventing short channel effects.

In various embodiments, the second doped region 212 may be implanted with ions same as for the first shallow doped region 211, e.g., by the single-angle ion implantation process. For example, the second doped region 212 may also include diffusion-preventing ions, such as C ions or N ions.

After the single-angle ion implantation process, an annealing process may be performed to activate the doping ions. In one embodiment, the annealing temperature may be in a range of approximately 900° C.~1100° C., and the annealing time may be in a range of approximately 10 seconds to 30 seconds.

As such, after the gate structure 207 is formed, the first shallow doped region 211 may be formed in the drain region 209 on one side of the gate structure 207 and in the drift region 203 under the bottom of the gate structure 207.

In one embodiment, the first shallow doped region 211 may be formed prior to forming the gate structure 207. The first shallow doped region 211 may be formed by: forming a drift region 203 in the semiconductor substrate 200, the drift region 203 surrounding the shallow trench isolation structure 201; forming a first shallow doped region 211 in the drift region 203, the first shallow doped region 211 surrounding the shallow trench isolation structure 201, where the first shallow doped region 211 may have the same doping type as that of the drain region 209 and the depth of the first shallow doped region 211 may be less than the depth of the drift region 203; forming a body region 208 in the semiconductor substrate 200 on a side of the drift region 203; forming a gate structure 207 on a portion of the body region 208, a portion of the drift region 203, a portion of the well region 202 in the semiconductor substrate 200, and a portion of the shallow trench isolation structure 201; forming a drain region 209 in the drift region 203 adjacent to one side of the gate structure 207, the depth of the drain region 209 being greater than the depth of the first shallow doped region 211 but less than the depth of the drift region 203; and forming a source region 210 in the body region 208 on the other side of the gate structure 207. In this embodiment, since the first shallow doped region 211 is formed before the formation of the gate structure 207, the impact of the gate structure 207 on the position, the concentration of impurity ions and the uniformity of the distribution of impurity ions of the first shallow doped region 211 may be prevented. Thus, the position accuracy of the first shallow doped region 211 and the uniformity of the impurity ion distribution in the first shallow doped region 211 may be improved.

The first shallow doped region 211 may be formed by an ion implantation process. A same mask may be used in forming the first shallow doped region 211 and the drift region 203. Although a non-zero implantation angle is used for forming the first shallow doped region 211 as described above, the first shallow doped region 211 may be formed by an ion implantation having a 0° incident angle (the implantation direction is perpendicular to the semiconductor substrate surface). Other process features are substantially the same as those described for forming the first shallow doped region 211 in the present disclosure. It is to be noted that, in this embodiment, the other features of the respective structures may also be referred to the features of the corresponding structures in the present disclosure, and the description thereof will not be repeated herein.

The present disclosure also provides an LDMOS transistor. As shown in FIG. 7, in one embodiment, the LDMOS transistor may include: a semiconductor substrate 200; a shallow trench isolation structure 201 located in the semiconductor substrate 200; a drift region 203 located in the semiconductor substrate 200, the drift region 203 surrounding the shallow trench isolation structure 201; a body region 208 located in the semiconductor substrate 200 on a side of the drift region 203; a gate structure 207 on a portion of the body region 208, a portion of the drift region 203, and a portion of the shallow trench isolation structure 201; a drain region 209 located in the drift region 203 on one side of the gate structure 207; a source region 210 located in the body region 208 on the other side of the gate structure 207; and a first shallow doped region 211 located in the drain region 209 on one side of the gate structure 207 and in the drift region 203 under the bottom of the gate structure 207. The doping type of the first shallow doped region 211 may be the same as that of the drain region 209, and the depth of the first shallow doped region 211 is less than that of the drain region 209 and the drift region 203.

The first shallow doped region 211 may have a depth of approximately 10 nm~50 nm and an ion doping concentration of approximately 1E18 atom/cm$^3$ to 1E19 atom/cm$^3$.

When the LDMOS transistor is a P-type LDMOS transistor, the doping type of the body region 208 is N-type, the doping type of the drift region 203 is P-type, the doping type of the drain region 209 is P-type, the doping type of the shallow doped region 211 is P-type, and the doping type of the source region 210 is P-type.

When the LDMOS transistor is an N-type LDMOS transistor, the doping type of the body region 208 is P-type, the doping type of the drift region 203 is N-type, the doping type of the drain region 209 is N-type, the doping type of the shallow doped region 211 is N-type, and the doping type of the source region 210 is N-type.

It should be noted that, other features and descriptions regarding the LDMOS transistor are referred to the corresponding features and descriptions for forming the LDMOS transistor in the present disclosure.

Although embodiments of the present disclosure have been described in detail, it will be apparent to those skilled in the art that the various changes, substitutions, and alterations could be made hereto without departing from the spirit and scope of the present disclosure.

What is claimed is:

1. A method of forming a lateral double-diffused MOSFET (LDMOS) transistor, comprising:
   forming a shallow trench isolation structure in a semiconductor substrate;
   forming a drift region in the semiconductor substrate, the drift region surrounding the shallow trench isolation structure;
   forming a body region in the semiconductor substrate and distanced from the drift region;
   forming a gate structure on a portion of each of the body region, the drift region, and the shallow trench isolation structure;
   forming a drain region in the drift region on one side of the gate structure;
   forming a source region in the body region on another side of the gate structure;
   forming a first shallow doped region in the drain region and the drift region to surround the shallow trench isolation structure, the first shallow doped region having a same doping type as for the drain region and a depth less than the drain region and the drift region; and
   forming a second doped region in the source region simultaneously when forming the first shallow doped region, wherein
   the second doped region has a first distance away from an adjacent side of the gate structure and a depth of the second doped region is less than a depth of the source region, and
   the second doped region has a same doping type as that of the source region.

2. The method according to claim 1, further including:
   performing a single-angle ion implantation process for forming the first shallow doped region without rotating the semiconductor substrate, the single-angle ion implantation process injecting ions in a direction from the drain region toward the source region with a first angle between an implanted ion incident direction and a normal to a surface of the semiconductor substrate.

3. The method according to claim 2, wherein:
the first shallow doped region has a depth of approximately 10 nm~50 nm and an ion doping concentration of approximately 1E18 atom/cm$^3$ to 1E19 atom/cm$^3$.

4. The method according to claim 1, wherein:
the LDMOS transistor is a P-type LDMOS transistor;
the doping type of the body region is N-type;
the doping type of the drift region is P-type;
the doping type of the drain region is P-type;
the doping type of the first shallow doped region is P-type; and
the doping type of the source region is P-type.

5. The method according to claim 4, wherein:
$BF_2$ ions or B ions are implanted to form the first shallow doped region using a single-angle ion implantation process.

6. The method according to claim 5, further including:
employing an implantation angle of approximately 15° to 40°, an implantation dose of approximately 1E13 atoms/cm$^2$ to 1E14 atoms/cm$^2$, and an implantation energy of approximately 5 Kev to 40 Kev for implanting $BF_2$ ions or B ions.

7. A method of forming a lateral double-diffused MOSFET (LDMOS) transistor, comprising:
forming a shallow trench isolation structure in a semiconductor substrate;
forming a drift region in the semiconductor substrate, the drift region surrounding the shallow trench isolation structure;
forming a body region in the semiconductor substrate and distanced from the drift region;
forming a gate structure on a portion of each of the body region, the drift region, and the shallow trench isolation structure;
forming a drain region in the drift region on one side of the gate structure;
forming a source region in the body region on another side of the gate structure; and
forming a first shallow doped region in the drain region and the drift region to surround the shallow trench isolation structure, the first shallow doped region having a same doping type as for the drain region and a depth less than the drain region and the drift region, wherein $BF_2$ ions or B ions are implanted to form the first shallow doped region using a single-angle ion implantation process, wherein
the LDMOS transistor is a P-type LDMOS transistor,
the doping type of the body region is N-type,
the doping type of the drift region is P-type,
the doping type of the drain region is P-type,
the doping type of the first shallow doped region is P-type,
the doping type of the source region is P-type, and
implanting diffusion-preventing ions during the single-angle ion implantation process, wherein the diffusion-preventing ions include C ions or N ions.

8. The method according to claim 7, further including:
employing an implantation angle of approximately 15° to 40°, an implantation dose of approximately 5E12 atoms/cm$^2$ to 5E15 atoms/cm$^2$, and an implantation energy of approximately 0.5 Kev to 20 Kev for implanting C ions or N ions.

9. The method according to claim 4, wherein:
a source-drain ion implantation process is performed for forming the source region and the drain region, the source-drain ion implantation process implanting one or more of B ions, $BF_2$ ions, Ga ions and In ions with an implantation angle of approximately 0°-5°, an implantation dose of approximately 5E13 atoms/cm$^2$ to 5E15 atoms/cm$^2$, and an implantation energy of approximately 6 Kev to 50 Kev.

10. The method according to claim 1, wherein:
the LDMOS transistor is an N-type LDMOS transistor;
the doping type of the body region is P-type;
the doping type of the drift region is N-type;
the doping type of the drain region is N-type;
the doping type of the first shallow doped region is N-type; and
the doping type of the source region is N-type.

11. The method according to claim 10, wherein:
P ions or As ions are implanted to form the first shallow doped region using a single-angle ion implantation process.

12. The method according to claim 11, further including:
employing an implantation angle of approximately 15° to 40°, an implantation dose of approximately 1E13 atoms/cm$^2$ to 1E14 atoms/cm$^2$, and an implantation energy of approximately 8 Kev to 45 Kev for implanting P ions or As ions.

13. The method according to claim 11, further including:
implanting diffusion-preventing ions during the single-angle ion implantation process, wherein the diffusion-preventing ions include C ions or N ions.

14. The method according to claim 13, further including:
employing an implantation angle of approximately 15° to 40°, an implantation dose of approximately 5E12 atoms/cm$^2$ to 5E15 atoms/cm$^2$, and an implantation energy of approximately 0.5 Kev to 20 Kev for implanting C ions or N ions.

15. The method according to claim 10, wherein:
a source-drain ion implantation process is performed in forming the source region and the drain region, the source-drain ion implantation process implanting one or more of P ions, As ions, and Sb ions with an implantation angle of approximately 0°~5°, an implantation dose of approximately 5E13 atoms/cm$^2$ to 5E15 atoms/cm$^2$, and an implantation energy of approximately 12 Kev to 50 Kev.

16. An LDMOS transistor, comprising:
a semiconductor substrate;
a shallow trench isolation structure in the semiconductor substrate;
a drift region located in the semiconductor substrate and surrounding the shallow trench isolation structure;
a body region located in the semiconductor substrate and distanced from the drift region;
a gate structure on a portion of each of the body region, the drift region, and the shallow trench isolation structure;
a drain region located in the drift region on one side of the gate structure;
a source region located in the body region on an other side of the gate structure; and
a first shallow doped region located in the drain region and in the drift region to surround the shallow trench isolation structure, the first shallow doped region having a same doping type as that of the drain region and a depth less than the drain region and the drift region, wherein
the first shallow doped region further includes diffusion-preventing ions, and
the diffusion-preventing ions include C ions or N ions.

17. The LDMOS transistor according to claim 16, wherein:
- the first shallow doped region has a depth of approximately 10 nm~50 nm and an ion doping concentration of approximately 1E18 atom/cm$^3$ to 1E19 atom/cm$^3$.

18. The LDMOS transistor according to claim 16, further including:
- a second doped region in the source region, wherein:
- the second doped region has a first distance away from an adjacent side of the gate structure and has a depth less than the source region.

19. The method according to claim 7, further including:
- employing an implantation angle of approximately 15° to 40°, an implantation dose of approximately 1E13 atoms/cm$^2$ to 1E14 atoms/cm$^2$, and an implantation energy of approximately 5 Kev to 40 Kev for implanting BF$_2$ ions or B ions.

20. The LDMOS transistor according to claim 16, wherein:
- the LDMOS transistor is an N-type LDMOS transistor;
- the doping type of the body region is P-type;
- the doping type of the drift region is N-type;
- the doping type of the drain region is N-type;
- the doping type of the first shallow doped region is N-type; and
- the doping type of the source region is N-type.

* * * * *